US012677405B2

(12) United States Patent
Lyding et al.

(10) Patent No.: US 12,677,405 B2
(45) Date of Patent: Jul. 7, 2026

(54) PRINTED STRUCTURE COMPRISING ALIGNED CARBON NANOTUBES FOR ELECTROMAGNETIC INTERFERENCE (EMI) SHIELDING

(71) Applicant: The Board of Trustees of the University of Illinois, Urbana, IL (US)

(72) Inventors: Joseph W. Lyding, Champaign, IL (US); Gang Wang, Urbana, IL (US)

(73) Assignee: THE BOARD OF TRUSTREES OF THE UNIVERSITY OF ILLINOIS, Urbana, IL (US)

( * ) Notice: Subject to any disclaimer, the term of this patent is extended or adjusted under 35 U.S.C. 154(b) by 792 days.

(21) Appl. No.: 17/902,077

(22) Filed: Sep. 2, 2022

(65) Prior Publication Data

US 2023/0072987 A1　Mar. 9, 2023

Related U.S. Application Data

(60) Provisional application No. 63/241,225, filed on Sep. 7, 2021.

(51) Int. Cl.
| *H05K 9/00* | (2006.01) |
| *B28B 1/00* | (2006.01) |
| *B33Y 10/00* | (2015.01) |
| *B33Y 80/00* | (2015.01) |

(52) U.S. Cl.
CPC ........... *H05K 9/0047* (2013.01); *B28B 1/001* (2013.01); *B33Y 10/00* (2014.12); *B33Y 80/00* (2014.12); *H05K 9/009* (2013.01)

(58) Field of Classification Search
None
See application file for complete search history.

(56) References Cited

U.S. PATENT DOCUMENTS 10,647,057 B2 * 5/2020 Therriault ............ C09D 105/08

OTHER PUBLICATIONS

Arjmand et al., "Electrical and electromagnetic interference shielding properties of flow-induced oriented carbon nanotubes in polycabonate", Apr. 20, 2011, Carbon, v. 49, p. 3430-3440. (Year: 2011).*
Avouris, P. et al., "Carbon-Based Electronics," Nature Nanotechnol. 2, (2007), pp. 605-615.
Castañeda-Uribe, O.A. et al., "Enhancing Electromagnetic Interference Shielding Effectiveness of Polymer Nanocomposites by Modifying Subsurface Carbon Nanotube Distribution," Adv. Eng. Mater. 23, 2000707 (2020), pp. 1-8.

(Continued)

*Primary Examiner* — Kim S. Horger
(74) *Attorney, Agent, or Firm* — Crowell & Moring LLP

(57) ABSTRACT

An electromagnetic interference (EMI) shielding material comprises a freestanding printed structure including aligned single-walled carbon nanotubes, wherein an alignment direction of the aligned single-walled carbon nanotubes coincides with a parallel direction of the freestanding printed structure, and wherein a property of the freestanding printed structure measured along the parallel direction is at least about 1.5 times as high as the property measured along a perpendicular direction of the freestanding printed structure.

20 Claims, 10 Drawing Sheets

(56)         References Cited

OTHER PUBLICATIONS

Chen, W. et al., "Flexible, Transparent, and Conductive $Ti_3C_2T_x$ MXene-Silver Nanowire Films with Smart Acoustic Sensitivity for High-Performance Electromagnetic Interference Shielding," ACS Nano 14, (2020), pp. 16643-16653.

Chen, Z. et al., "Lightweight and Flexible Graphene Foam Composites for High-Performance Electromagnetic Interference Shielding. ," Adv. Mater. 25, (2013), pp. 1296-1300.

Chung, D.D.L. et al., "Electromagnetic interference shielding effectiveness of carbon materials," Carbon 39, (2001), pp. 279-285.

De France, K. et al., "Functional Materials from Nanocellulose: Utilizing Structure-Property Relationships in Bottom-Up Fabrication," Adv. Mater. 33, (2020), pp. 1-22.

De Volder et al., "Carbon Nanotubes: Present and Future Commercial Applications," Science 339, (2013), pp. 535-539.

Hamedi, M.M. et al., "Highly Conducting, Strong Nanocomposites Based on Nanocellulose-Assisted Aqueous Dispersions of Single-Wall Carbon Nanotubes," ACS Nano 8, 3, (2014), pp. 2467-2476.

Huang, Y.-F. et al., "Highly Anisotropic, Thermally Conductive, and Mechanically Strong Polymer Composites with Nacre-like Structure for Thermal Management Applications," ACS Appl. Nano Mater. 1, (2018), pp. 3312-3320.

Iqbal, A. et al., "2D MXenes for Electromagnetic Shielding: A Review," Adv. Funct. Mater. 30, (2020), pp. 1-25.

Iqbal, A.et al., "Anomalous absorption of Electromagnetic Waves by 2D Transition Metal Carbonitride $Ti_{CNTx}$ (Mxene)," Science 369, (2020), pp. 446-450.

Koziol, K. et al., "High-Performance Carbon Nanotube Fiber," Science 318, (2007), pp. 1892-1895.

Li, N. et al., "Electromagnetic Interference (EMI) Shielding of Single-Walled Carbon Nanotube Epoxy Composites," Nano Lett. 6, 6 (2006), pp. 1141-1145.

Li, T. et al., "Anisotropic, Lightweight, Strong, and Super Thermally Insulating Nanowood with Naturall Aligned Nanocellulose," Sci. Adv. 4, (2018), pp. 1-9.

Lipton, J. et al., "Scalable, Highly Conductive, and Micropatternable MXene Films for Enhanced Electromagnetic Interference Shielding," Matter 3, (2020), pp. 546-557.

Liu, J. et al., "Hydrophobic, Flexible, and Lightweight MXene Foams for High-Performance Electromagnetic-Interference Shielding," Adv. Mater. 29, 1702367, (2020), pp. 1-6.

Liu, Q. et al., "Nanostructured Carbon Materials Based Electrothermal Air Pump Actuators," Nanoscale 6, (2014), pp. 6932-6938.

Liu, X. et al., "Off/on Switchable Smart Electromagnetic Interference Shielding Aerogel," Matter 4, (2020), pp. 1735-1747.

Lu, J.P. et al., "Elastic Properties of Carbon Nanotubes and Nanoropes," Phys. Rev. Lett. 79, 7, (1997), pp. 1297-1300.

Lu, S. et al., "Flexible, Mechanically Resilient Carbon Nanotube Composite Films for High-Efficiency Electromagnetic Interference Shielding," Carbon 136, (2018), pp. 387-394.

Noerochim, L. et al., "Free-Standing Single-Walled Carbon Nanotube/ $SnO_2$ Anode Paper for Flexible Lithium-ion Batteries," Carbon 50, (2012), pp. 1289-1297.

Pettes, M.T. et al., "Thermal and Structural Characterizations of Individual Single-, Double-, and Multi-Walled Carbon Nanotubes," Adv. Funct. Mater. 19, (2009), pp. 3918-3925.

Radosavljević, M. et al., "High-Field Electrical Transport and Breakdown in Bundles of Single-Wall Carbon Nanotubes," Phys. Rev. B 64, (2001), pp. 241307-1-241307-4

Shahzad, F. et al., "Electromagnetic Interference Shielding with 2D Transition Metal Carbides (MXenes)," Science 353, 6304, (2016), pp. 1137-1140.

Shen, B. et al., "Ultrathin Flexible Graphene Film: An Excellent Thermal Conducting Material with Efficient EMI Shielding," Adv. Funct. Mater. 24, (2014), pp. 4542-4548.

Shui, X. et al., "Nickel Filament Polymer-Matrix Composites with Low Surface Impedance and High Electromagnetic Interference Shielding Effectiveness," J. Electron. Mater. 26, 8, (1997), pp. 928-934.

Song, Q. et al., "Carbon Nanotube-Multilayered Graphene Edge Plane Core-Shell Hybrid Foams for Ultrahigh-Performance Electromagnetic-Interference Shielding," Adv. Mater. 29, 1701583, (2017), pp. 1-8.

Tan, C. et al., "A High Performance Wearable Strain Sensor with Advanced Thermal Management for Motion Monitoring," Nat. Commun. 11, 3530, (2020), pp. 1-10.

Thess, A. et al., "Crystalline Ropes of Metallic Carbon Nanotubes," Science 273, (1996), pp. 483-487.

Thomassin, J.-M. et al., "Polymer/Carbon Based Composites as Electromagnetic Interference (EMI) Shielding Materials," Mater. Sci. Engineer. R Rep. 74, (2013), pp. 211-232.

Wan, Y.-J. et al., "Ultralight, Super-Elastic and Volume-Preserving Cellulose Fiber/Graphene Aerogel for High-Performance Electromagnetic Interference Shielding," Carbon 115, (2017), pp. 629-639.

Wan, Y.J. et al., "Ultrathin Densified Carbon Nanotube Film with 'Metal-like' Conductivity, Superior Mechanical Strength, and Ultrahigh Electromagnetic Interference Shielding Effectiveness," ACS Nano 14, (2020), pp. 14134-14145.

Watts, P.C.P. et al., "High Permittivity from Defective Multiwalled Carbon Nanotubes in the X-Band," Adv. Mater. 15, 7-8, (2003), pp. 600-603.

Wei, Q. et al., "Superhigh Electromagnetic Interference Shielding of Ultrathin Aligned Pristine Graphene Nanosheets Film," Adv. Mater. 32, 1907411, (2020), pp. 1-9.

Wen, B. et al., "Reduced Graphene Oxides: Light-Weight and High-Efficiency Electromagnetic Interference Shielding at Elevated Temperatures," Adv. Mater. 26, (2014), pp. 3484-3489.

Weng, G.-M.et al., "Layer-by-Layer Assembly of Cross-Functional Semi- transparent MXene-Carbon Nanotubes Composite Films for Next-Generation Electromagnetic Interference Shielding," Adv. Funct. Mater. 28, 1803360, (2018), pp. 1-9.

Yan, D.-X. et al., "Structured Reduced Graphene Oxide/Polymer Composites for Ultra-Efficient Electromagnetic Interference Shielding," Adv. Funct. Mater. 25, (2015), pp. 559-566.

Yang, Y. et al., "Conductive Carbon Nanofiber-Polymer Foam Structures," Adv. Mater. 17, (2020), pp. 1999-2003.

Yousefi, N. et al., "Highly Aligned Graphene/Polymer Nanocomposites with Excellent Dielectric Properties for High-Performance Electromagnetic Interference Shielding," Adv. Mater. 26, (2014), pp. 5480-5487.

Yu, M.F. et al., "Tensile Loading of Ropes of Single Wall Carbon Nanotubes and their Mechanical Properties," Phys. Rev. Lett. 84, 24, (2000), pp. 5552-5555.

Zeng, Z. et al., "Flexible and Ultrathin Waterproof Cellular Membranes Based on High-Conjunction Metal-Wrapped Polymer Nanofibers for Electromagnetic Interference Shielding," Adv. Mater. 32, 1908496, (2020), pp. 1-7.

Zeng, Z. et al., "Lightweight and Anisotropic Porous MWCNT/ WPU Composites for Ultrahigh Performance Electromagnetic Interference Shielding," Adv. Funct. Mater. 26, (2016), pp. 303-310.

Zeng, Z. et al., "Microstructure Design of Lightweight, Flexible, and High Electromagnetic Shielding Porous Multiwalled Carbon Nanotube/Polymer Composites," Small 13, 1701388, (2017), pp. 1-9.

Zeng, Z. et al., Nanocellulose Assisted Preparation of Ambient Dried, Large-Scale and Mechanically Robust Carbon Nanotube Foams for Electromagnetic Interference Shielding, J. Mater. Chem. A 8, (2020), pp. 17969-17979.

Zeng, Z. et al., "Ultralight and Highly Elastic Graphene/Lignin-Derived Carbon Nanocomposite Aerogels with Ultrahigh Electromagnetic Interference Shielding Performance," ACS Appl. Mater. Interfaces 10, (2018), pp. 8205-8213.

Zeng, Z. et al., "Ultralight, Flexible, and Biomimetic Nanocellulose/ Silver Nanowire Aerogels for Electromagnetic Interference Shielding." ACS Nano 14, (2020), pp. 2927-2938.

Zeng, Z. et al., "Nanocellulose-MXene Biomimetic Aerogels with Orientation-Tunable Electromagnetic Interference Shielding Performance," Adv Sci 7, 2000979, (2020), pp. 1-9.

Zhang, D. et al., "Multi-functional CNT Nanopaper Polyurethane Nanocomposite Fabricated by Ultrasonic Infiltration and Dip Soaking Processes," Comp. Part B: Eng. 182, 107646, (2020), pp. 1-9.

(56) References Cited

OTHER PUBLICATIONS

Zhang, D. et al., "Performance Study of Ultrasonic Assisted Processing of CNT Nanopaper/Solventless Epoxy Composite," Comp. Part B: Eng. 159, (2019), pp. 327-335.

Zhang, J. et al., "Scalable Manufacturing of Free-Standing, Strong $Ti_3C_2T_x$ MXene Films with Outstanding Conductivity," Adv. Mater. 32, 2001093, (2020), pp. 1-9.

Zhang, Y. et al., "Broadband and tunable high-performance microwave absorption of an ultralight and highly compressible graphene foam," Adv. Mater. 27, (2015), pp. 2049-2053.

* cited by examiner

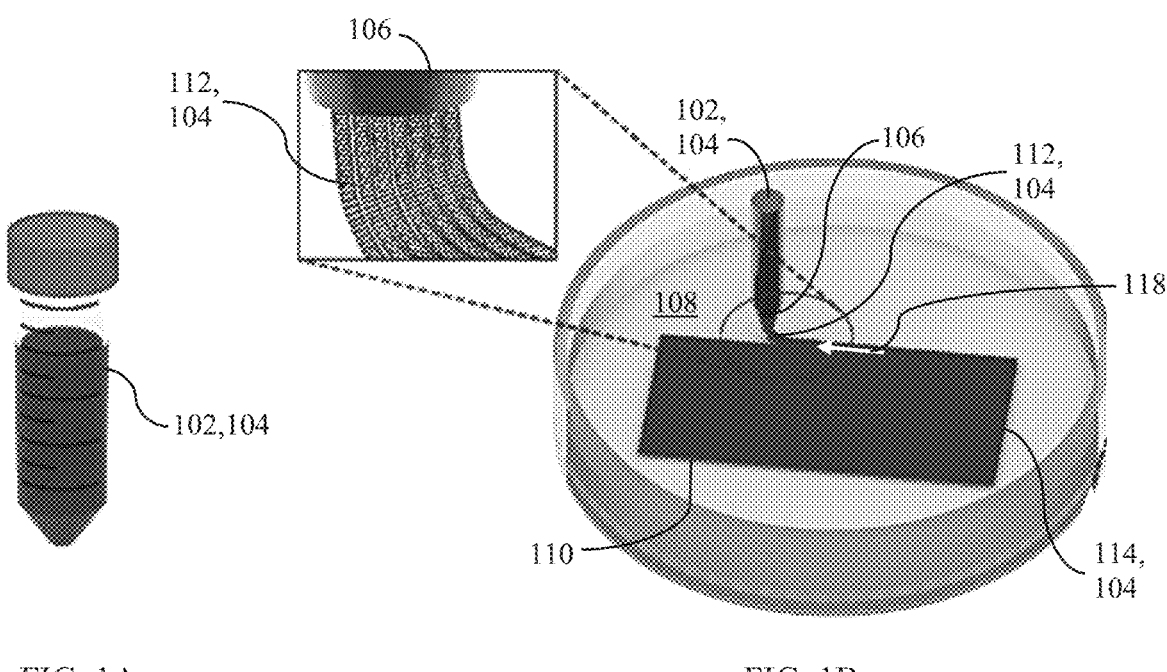
FIG. 1A
FIG. 1B
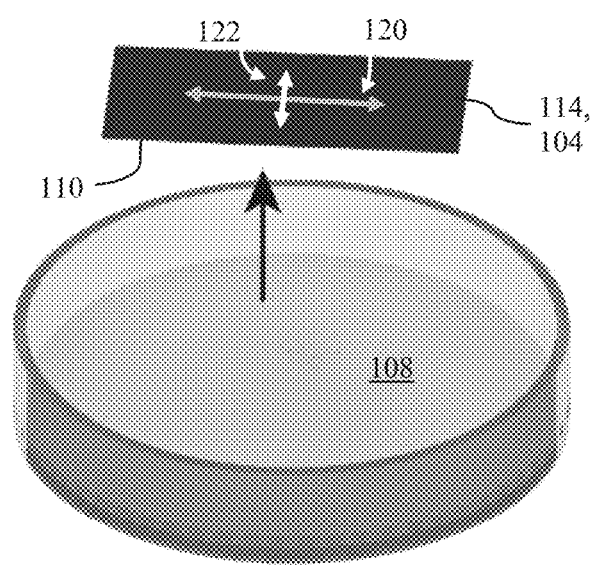
FIG. 1C

FIG. 2A                                    FIG. 2B
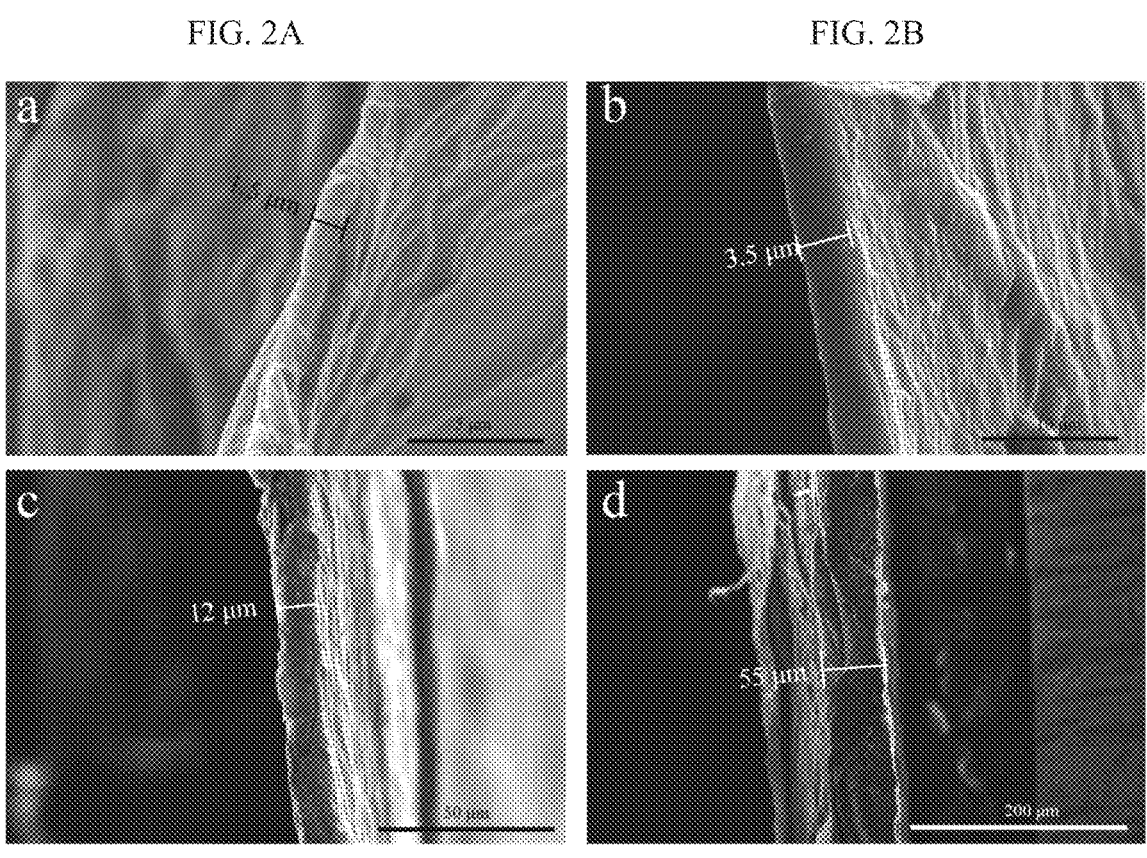
FIG. 2C                                    FIG. 2D

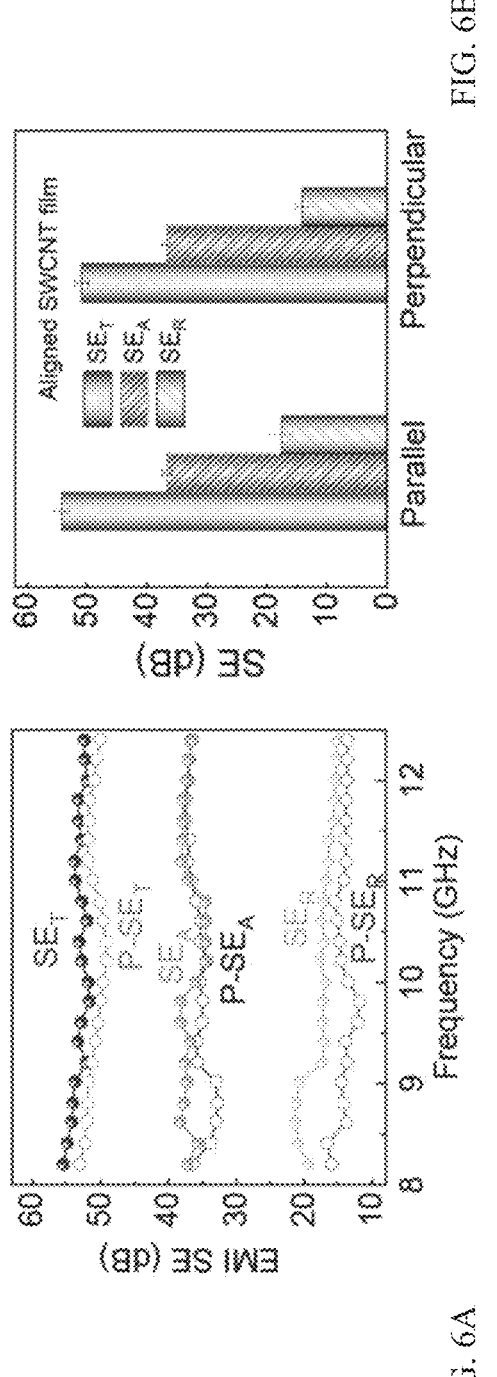
FIG. 6A
FIG. 6B
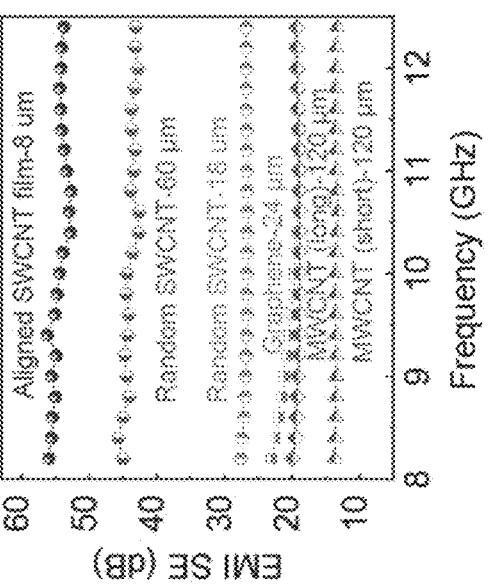
FIG. 6C

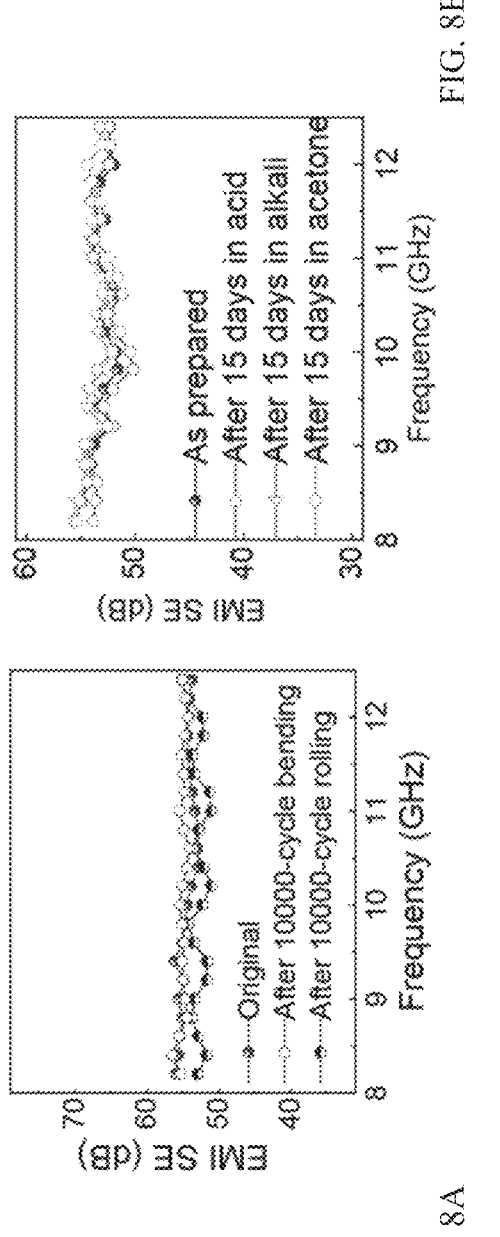
FIG. 8B
FIG. 8A
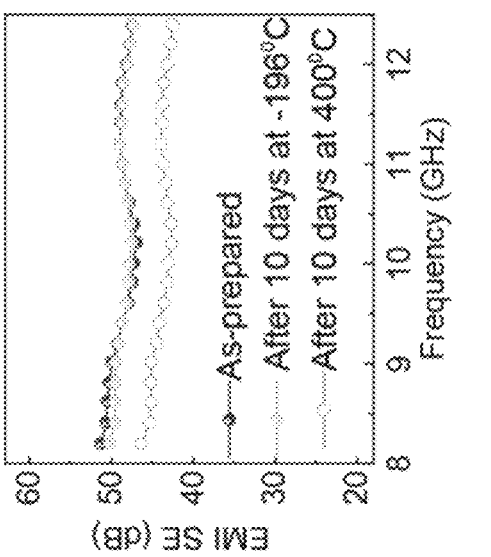
FIG. 8C

PRINTED STRUCTURE COMPRISING ALIGNED CARBON NANOTUBES FOR ELECTROMAGNETIC INTERFERENCE (EMI) SHIELDING

RELATED APPLICATION

The present patent document claims the benefit of priority under 35 U.S.C. § 119(e) to U.S. Provisional Patent Application No. 63/241,225, which was filed on Sep. 7, 2021, and is hereby incorporated by reference in its entirety.

TECHNICAL FIELD

The present disclosure relates generally to carbon nanotubes and more particularly to a freestanding printed structure comprising aligned carbon nanotubes.

BACKGROUND

With the continuing reliance on and proliferation of electronics, increased failure of electronic equipment and potential health impacts due to greater electromagnetic interference (EMI) and pollution is inevitable. The urgent need for a solution in the form of high-performance EMI shielding materials is made particularly clear by the development of high-frequency, high-speed, fifth-generation (5G) and inevitable sixth-generation (6G) technologies. An ideal shielding material would integrate superb shielding properties with high thermal conductivity, mechanical strength, flexibility, reliability, and durability even in extreme environments achieved while maintaining thin layers and a low density. performance of these novel shielding macrostructures. More efficient, convenient, green, and scalable preparation techniques to facilitate research into more reliable and high-performance EMI shielding materials are highly desired. Furthermore, the growth of industries such as the internet of things creates significant demand for a material that, in addition to EMI shielding performance, also demonstrates impressive properties such as miniaturization and integration potential, excellent electrical and thermal conductivities, good hydrophobicity, high resistance to mechanical deformation, and reliability in extreme environments all while remaining ultrathin and lightweight.

BRIEF SUMMARY

An electromagnetic interference (EMI) shielding material comprises a freestanding printed structure including aligned single-walled carbon nanotubes, wherein an alignment direction of the aligned single-walled carbon nanotubes coincides with a parallel direction of the freestanding printed structure, and wherein a property of the freestanding printed structure measured along the parallel direction is at least about 1.5 times as high as the property measured along a perpendicular direction of the freestanding printed structure.

A method of making an EMI shielding material comprises: continuously injecting a carbon material solution comprising single-walled carbon nanotubes through a nozzle into a coagulation liquid and moving the nozzle relative to a substrate submerged in the coagulation liquid, thereby forming an extruded filament comprising the single-walled carbon nanotubes and aligning the carbon nanotubes along an axis of the extruded filament; depositing the extruded filament onto the substrate as the nozzle is moved along a print path, thereby forming a printed structure comprising the single-walled carbon nanotubes aligned along the print path; and, after deposition, removing the printed structure from the substrate, thereby forming a freestanding printed structure comprising aligned single-wall carbon nanotubes.

BRIEF DESCRIPTION OF THE DRAWINGS

FIGS. 1A-1C are schematics showing an exemplary printing fabrication process for making an EMI shielding material comprising aligned single-walled carbon nanotubes (SWCNTs).

FIGS. 2A-2D show scanning electron microscope (SEM) images of as-prepared freestanding printed films having different values of thickness: (a) 1.5 μm, (b) 3.5 μm, (c) 12 μm, and (d) 55 μm.

FIGS. 6A and 6B show EMI shielding performance of the freestanding printed structures (8 μm thickness) in the X-band and at 10 GHz, respectively, in different directions with respect to the electric field direction of incident EM waves.

FIG. 6C shows EMI SE of the freestanding printed structures (8 μm thickness; top data set) compared to vacuum filtrated random network SWCNT buckypaper, reduced graphene oxide (rGO) film, and MWCNT buckypapers of different aspect ratios.

FIG. 8A shows EMI SE of the freestanding printed structure after 10000-cycle bending and rolling in the whole X-band frequency range.

FIGS. 8B and 8C show EMI SE of the as-prepared freestanding printed films before and after strong acid, alkali or acetone immersion treatments and before and after low/high temperature treatments, respectively; notably, the EMI SE is nearly unchanged after long-term storage in harsh environments, revealing a high chemical and structural stability of the SWCNT film.

DETAILED DESCRIPTION

Ultrathin, lightweight, and flexible structures comprising aligned single-walled carbon nanotubes are fabricated by a facile, environmentally friendly, and scalable printing methodology. The aligned pattern and outstanding intrinsic properties of the single-walled carbon nanotubes may impart "metal-like" thermal and electrical conductivities to the printed structures, as well as excellent mechanical strength, flexibility, and hydrophobicity. Further, the aligned microstructure may promote the electromagnetic interference (EMI) shielding ability of the single-walled carbon nanotubes, leading to excellent shielding effectiveness (SE) of ~39 to 90 dB despite a low density (e.g., ~0.6 g/cm³) and thickness (e.g., 1.5 to 24 μm). In some examples, the printed single-walled carbon nanotube structures may take the form of freestanding printed films. An ultrahigh thickness-specific SE of over 25,000 dB/mm and an unprecedented normalized specific SE of over 400,000 dB·cm²/g may be attained by the freestanding printed films, significantly surpassing previously reported shielding materials. In addition to an EMI SE greater than 54 dB in an ultra-broadband frequency range of around 400 GHz, the printed structures may exhibit excellent EMI shielding stability and reliability when subjected to mechanical deformation, chemical corrosion (e.g., acid, alkali, and/or organic solvents), and high/low temperature environments. The novel single-wall carbon nanotube structures may offer significant potential for practical applications in the aerospace, defense, precision components, and smart wearable electronics industries.

Figure 1D:
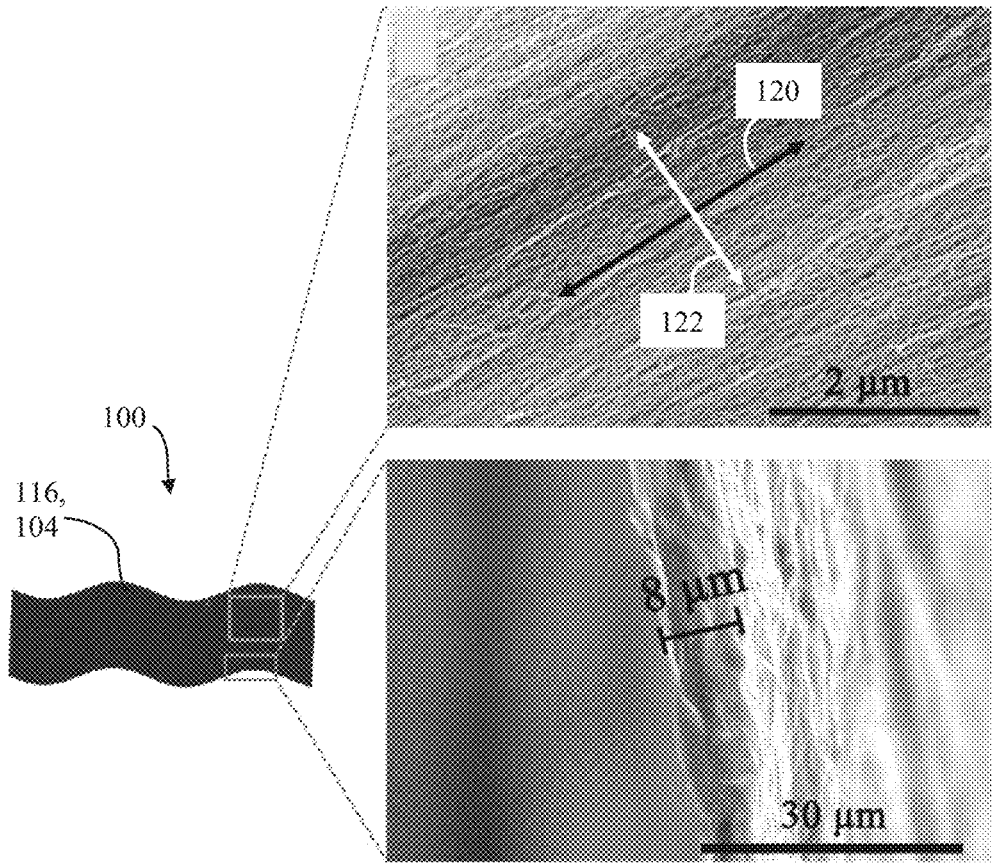
FIG. 1D is a schematic of a freestanding printed structure (or film) comprising aligned single-walled carbon nanotubes along with scanning electron microscope (SEM) images showing details of the structure.

A method of making an EMI shielding material is described in reference to FIGS. 1A-1C, where the EMI shielding material 100 comprises a freestanding printed structure 116 including aligned single-wall carbon nanotubes 104 (FIG. 1D). The method comprises continuously injecting a carbon material solution 102 (FIG. 1A) comprising single-walled carbon nanotubes 104 through a nozzle 106 into a coagulation liquid 108, and moving the nozzle 106 relative to a substrate 110 submerged in the coagulation liquid 108, as illustrated in FIG. 1B. Each of the single-walled carbon nanotubes 104 may be understood to comprise a single layer of graphene rolled up to form a single-walled tubular structure. As the carbon material solution 102 flows through the nozzle 106 and is pulled through the coagulation liquid 108, an extruded filament 112 comprising the single-walled carbon nanotubes 104 is formed with the carbon nanotubes 104 aligned along a longitudinal axis of the extruded filament 112. The extruded filament 112 is deposited onto the substrate 110 as the nozzle 106 is moved along a print path 118, thereby forming a printed structure 114 comprising the single-walled carbon nanotubes 104, where the single-walled carbon nanotubes 104 are aligned with the print path 118. Because the printing structure 114 is formed by extruding the carbon material solution through a nozzle 106 to create one or more extruded filaments 112 along the print path, the printed structure 114 may be described in some examples as including one or more extruded filaments 112 comprising the aligned single-walled carbon nanotubes 104. After deposition, the printed structure 114 is removed from the coagulation liquid 108, as illustrated in FIG. 1C. Upon removal of the printed structure 114 from the substrate 110, a freestanding printed structure 116 comprising aligned single-wall carbon nanotubes 104 is formed, as shown in FIG. 1D.

The carbon material solution 102 includes, in addition to the single-walled carbon nanotubes 104, a liquid such as deionized water or an organic solvent. The single-walled carbon nanotubes are typically included in the carbon material solution at a concentration in a range from about 1 mg/ml to about 5 mg/ml, or from about 2 mg/ml to about 4 mg/ml. The coagulation liquid 108 into which the carbon material solution 102 is injected may comprise an organic solvent such as isopropyl alcohol, ethanol, methanol, and/or acetone.

The single-walled carbon nanotubes 104 aligned with the longitudinal axis of the extruded filament 112 may be oriented within about +/−10 degrees of the axis. The extruded filament 112 may be deposited layer by layer onto the substrate 110. Accordingly, the printed structure 114 and the free-standing printed structure 116 may include from two to ten layers. The extruded filament 112 may have a width or diameter in a range from about 100 nm to about 100 microns, or from about 100 nm to about 1 micron. Typically, the freestanding printed structure 116 has a thickness of about 55 microns or less, about 25 microns or less, about 8 microns or less, and as low as about 1.5 microns. The freestanding printed structure 116 may in some examples be described as a freestanding printed film, e.g., due to the microscale thickness.

FIG. 1C shows removal of the printed structure 114 from the coagulation liquid 108. The printed structure 114 may further be removed from the substrate 110, e.g., by peeling away from the substrate 110. Typically, the substrate 110 comprises a polymer, such as silicone rubber, or metal. The substrate 110 may be rigid or flexible. The printed structure 114, before or after removal from the substrate 110, may be rinsed in deionized water to remove any remaining solvent, and/or dried.

Prior to the continuous injection of the carbon material solution 102 through the nozzle 106, the carbon material solution 102 may undergo sonication to ensure thorough mixing. The sonication may take place for a time duration of about 5 min to about 2 hours. Prior to sonication, the single-walled carbon nanotubes may be purified using methods known in the art. The nozzle 106 employed for the continuous injection may have a flat tip.

Referring again to FIG. 1D, the EMI shielding material 100 formed as described above comprises a freestanding printed structure 116 including aligned single-walled carbon nanotubes 104. A "freestanding" printed structure 116 is understood not to be attached to a substrate 110. The alignment direction of the single-walled carbon nanotubes 104 coincides with a parallel direction 120 of the printed structure 114 and the freestanding printed structure 116. More specifically, the aligned single-walled carbon nanotubes 104 may be oriented within about +/−10 degrees of the parallel direction 120. It is understood that the parallel direction 120 is aligned with the longitudinal axis of the extruded filament(s) 112 arranged to form the printed structure 114, with the exception of any parts of the structure 114 where a continuously extruded filament 112 makes a turn (e.g., a 180-degree turn as the print path changes from left-to-right to right-to-left). Due to the printing process employed for fabrication, the printed structure 114, 116 may be understood to include primarily (80%-99%) or exclusively (100%) aligned single-walled carbon nanotubes (as opposed to non-aligned single-walled carbon nanotubes) that are preferably oriented within +/−10 degrees of the parallel direction 120. Advantageously, due to this alignment, a property of the freestanding printed structure 116 measured along the parallel direction 120 may be at least about 1.5 times as high as the property measured along a perpendicular direction 122 of the freestanding printed structure 116. The property may be thermal conductivity, electrical conductivity, and/or mechanical strength.

For example, as supported by data discussed below, the thermal conductivity measured along the parallel direction 120 may be at least about 3 times as high, or at least about 4 times as high, as the thermal conductivity measured along the perpendicular direction 122. In another example, the electrical conductivity measured along the parallel direction 120 may be at least about 2 times as high as the electrical conductivity measured along the perpendicular direction 122. Also or alternatively, the mechanical strength measured along the parallel direction 120 may be at least about 2 times as high as the mechanical strength measured along the perpendicular direction 122, where mechanical strength may refer for example to tensile strength.

The freestanding printed structure 116 may have a thickness-specific shielding effectiveness (SE/d), where d represents thickness, of at least about 3,750 dB/mm, 12,000 dB/mm, at least about 20,000 dB/mm, or at least about 23,000 dB/mm. In some examples, the SE/d may be as high as about 26,000 dB/mm. As described above, the freestanding printed structure 116 may have a thickness of about 55 microns or less, about 25 microns or less, about 8 microns or less, and as low as about 1.5 microns.

The freestanding printed structure 116 may have a density of no greater than about 0.8 g/cm$^3$, or no greater than about 0.6 g/cm$^3$. The printed freestanding structure 116 may comprise a normalized specific shielding effectiveness (SSE), that is, SE/d divided by density, of at least about 37,000 dB·cm$^2$/g. Considering the low density of the freestanding printed films, the SSE can reach unprecedented values. For example, the SSE may be as high as about 233,000 dB·cm$^2$/g, or as high as 428,222 dB·cm$^2$/g, significantly surpassing that of other EMI shielding materials, including carbon-based solid and porous materials, metal-based solid materials and foams, and MXene-based shields. With an exceptionally high EMI SE value of around 90 dB, a freestanding printed film of 24 μm in thickness may simultaneously reach an ultrahigh SSE value of 62,500 dB·cm$^2$/g; in sharp contrast, typical metal shields such as solid copper or stainless steel and most commonly used polymer nanocomposites have SSE values of a few tens to hundreds of dB·cm$^2$/g, which is three to four orders of magnitude lower than the SWCNT freestanding printed films. Beneficially, the shielding effectiveness (SE) of the printed freestanding structure may be substantially unchanged before and after exposure to 10,000-cycle bending or rolling tests, acid, alkali, or acetone immersion treatments, and/or −196° C. or 400° C. temperature treatments.

The freestanding printed structure 116 may have a porosity of about 60%, or higher. The aligned single-walled carbon nanotubes 104 may account for at least about 70%, at least about 80%, or at least about 90% of a total mass of the freestanding printed structure 116. Also or alternatively, at least about 30%, at least about 60%, or at least about 90% of the aligned single-walled carbon nanotubes 194 may be metallic. The aligned single-walled carbon nanotubes 104 may have an average length in a range from about 3 microns to about 10 microns.

EXAMPLES

Fabrication

An exemplary printing fabrication process of the freestanding printed structures that may be used as EMI shielding materials is described in reference to FIGS. 1A-1D.

Purified SWCNT powders were dispersed in deionized water through an ultrasonication process to form a well-dispersed carbon material solution 102, which was then loaded into a syringe pump (or "nozzle") 106 mounted onto a custom 3D printer system. The 3D printer system and software enabled precisely controlled movements and print path planning of the syringe 106. During printing, the carbon material solution 102 was continuously extruded through the nozzle 106 to form a continuous filament 112 deposited onto a silicone rubber substrate 110 in an isopropyl alcohol (IPA) coagulation liquid 108, as illustrated in FIG. 1B. The dragging force caused by the movement of the syringe (nozzle) 106 through the coagulation liquid 108 resulted in the formation of aligned SWCNT bundles 104 within the filament 112. The 3D printer system allowed for rapid and facile adjustments to the size and configuration of the filaments 112 to create printed structures (films) 114. The weak interaction between SWCNT and rubber made it feasible to separate the SWCNT printed film 114 from the substrate 110 after drying, forming a freestanding printed structure 116, as shown in FIG. 1D.

The aligned microstructure of the SWCNT films is observed along the motion direction of the nozzle (dark arrow) during printing. Moreover, by adjusting the number of printing passes, that is, the print path of the nozzle, the film width (along the direction of the white arrow) and thickness of the SWCNT film may be readily controlled. A typical, large-area (10×20 cm$^2$) SWCNT film with a thickness of 8 μm is shown in the SEM image of FIG. 1D, although the thickness of mechanically robust freestanding films may be as low as 1.5 μm, as illustrated in FIGS. 2A-2D. Fabrication of a meter-long freestanding and flexible SWCNT film has been achieved and demonstrates the potential for scalable production. In addition to printing aligned SWCNT films by simple movements of the nozzle, this programmable printing process has the capability of constructing complex patterns and advanced architectures.

Characterization and Properties

The outstanding intrinsic properties of the SWCNTs combined with the neoteric fabrication process lead to interesting emergent properties in the resulting freestanding printed structures or films. Due to their ordered microstructure, the freestanding SWCNT films are incredibly robust when bent, rolled, and folded. For example, an origami boat made from the film can float on water due to the film's lightweight and hydrophobic nature. As moisture is an important parameter affecting the stability, reliability, and durability of electronics, the demonstrated hydrophobicity of the freestanding printed structures is important. A water contact angle as high as 125° has been observed for the freestanding printed structures, which lends excellent waterproof capability. The printed structure can maintain its original freestanding shape and structural integrity even after immersion in water for fifteen days followed by an additional ten-minute sonication treatment. Despite this hydrophobicity, a porosity of ~60% for the low-density freestanding printed film (~0.6 g/cm$^3$) allows for high air-permeability such that the pressure drop across the cellular SWCNT macrostructures is lower than that of commercial N95 masks. These properties, combined with the facile and scalable printing methodology (which is capable of integrating additional functional additives such as magnetic materials), make the SWCNT films a promising prospect for the design and production of multifunctional smart electronics or textiles.

Figure 3A:
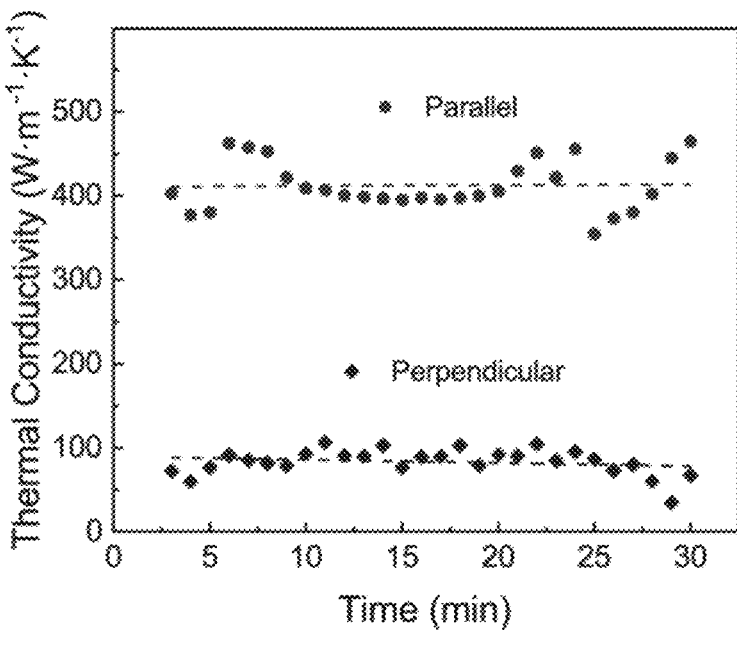
FIGS. 3A and 3B show typical measured thermal conductivity and average thermal conductivity, respectively, of freestanding printed structures in parallel and perpendicular directions of the structures, and also pure metal plates (silver, copper and aluminum).
Figure 3B:
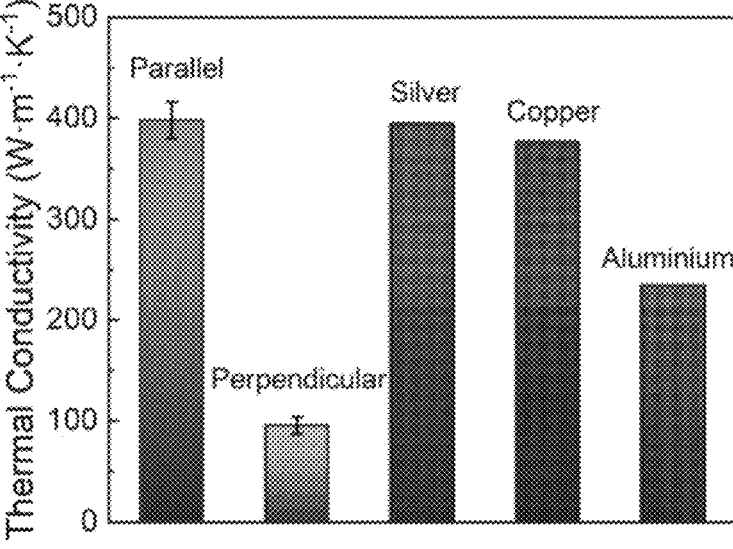

High thermal conductivity is important for the continued progress of electronics due to the demands of rapidly developing high-speed communication and signal processing technologies. The thermal conductivity of the SWCNT freestanding printed film was measured using a custom-designed apparatus including a vacuum chamber, float and fixed stages for holding the test sample, and two thermometers. The films exhibit anisotropic thermal conductivities in parallel and perpendicular orientations with respect to the film's alignment (or print) direction, as shown by the data of FIG. 3A. The thermal conductivity in the parallel direction is around 398 $W \cdot m^{-1} \cdot K^{-1}$, which exceeds that of aluminum, copper, and even silver, as shown in FIG. 3B, and is about 140 times higher than MXene (2.84 $W \cdot m^{-1} \cdot K^{-1}$) and about two times higher than graphene films (190 $W \cdot m^{-1} \cdot K^{-1}$), respectively. The thermal conductivity in the perpendicular direction is about 96 $W \cdot m^{-1} \cdot K^{-1}$. This yields an anisotropic thermal conductivity ratio greater than four, demonstrating the film's potential as a material for thermal management devices.

Figure 4A:
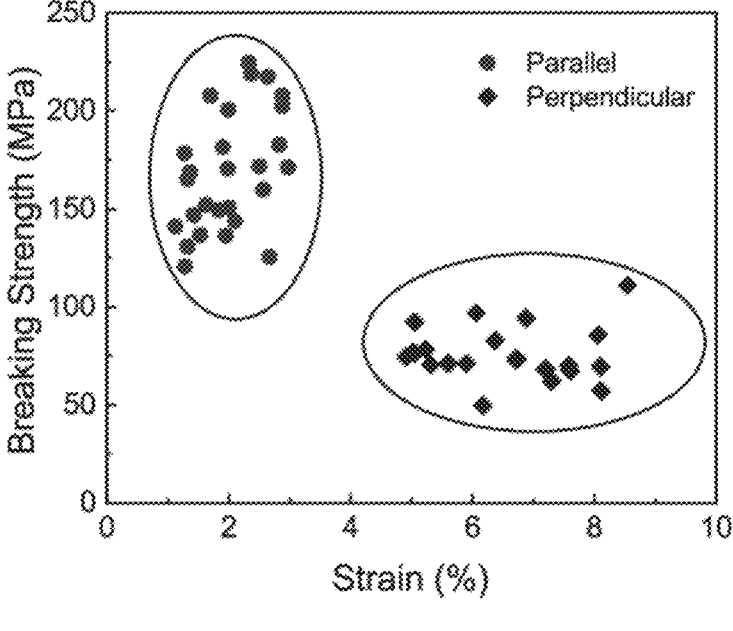
FIGS. 4A and 4B show plots of measured breaking strength and average tensile strength and Young's modulus, respectively, of freestanding printed structures in parallel and perpendicular directions.
Figure 4B:
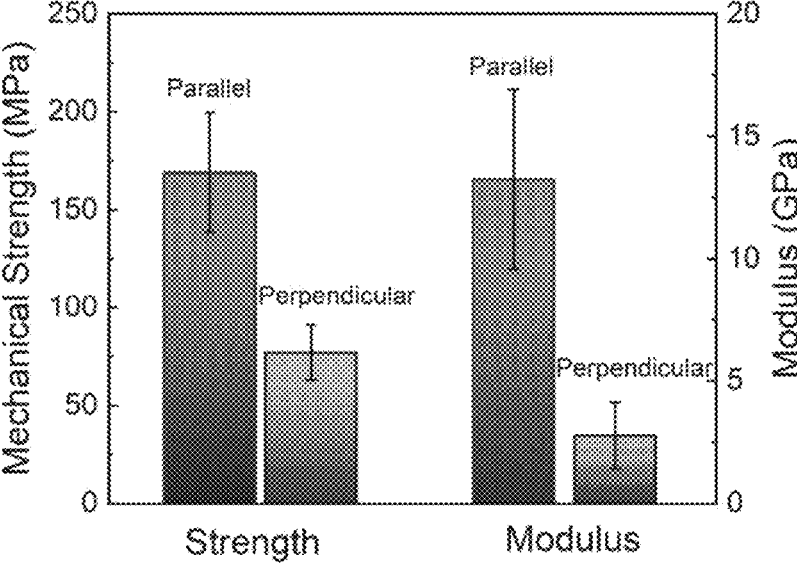

Similarly, the tensile properties of the freestanding printed films were investigated and found to be anisotropic, as shown in FIGS. 4A and 4B. The parallel direction tends to have higher strength and lower breaking strain in comparison to the perpendicular direction, a further derivative of the aligned structure in the films. In the parallel direction, the SWCNT films have an average mechanical strength as high as 169 MPa and a Young's modulus of 13.3 GPa; the perpendicular direction measures 77 MPa and 2.8 GPa, respectively.

Figure 5A:
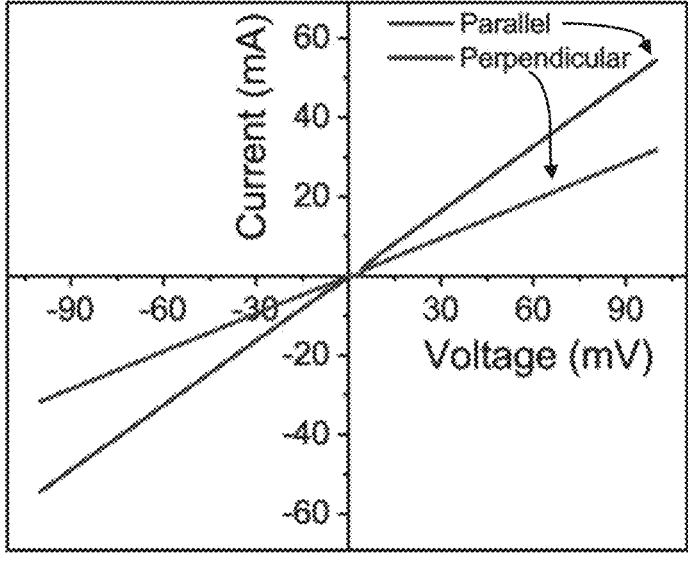
FIGS. 5A and 5B show typical I-V curves of freestanding printed structures and average electrical conductivity of freestanding printed structures in parallel and perpendicular directions in comparison with random network SWCNT buckypaper.
Figure 5B:
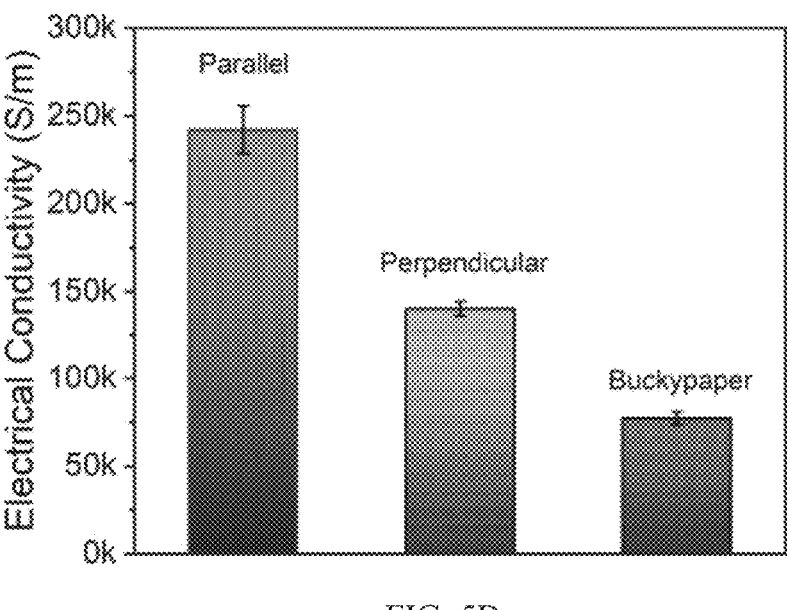

The remarkable intrinsic properties of SWCNTs combine with aligned microstructure in the as-prepared freestanding printed films to generate remarkable electrical properties. Typical I-V curves for the SWCNT films were measured in both orientations using a standard four-probe technique, as shown in FIG. 5A. The average electrical conductivity in the parallel direction is 242,988 S/m compared with 140,102 S/m in the perpendicular direction, as can be seen in FIG. 5B. For further comparison, random network SWCNT buckypaper was prepared from a vacuum filtration of the same raw material and contrasted against the freestanding printed film. Despite the high energy cost of the vacuum filtration process, the SWCNT buckypaper shows an inferior electrical conductivity of 77,323 S/m, which is attributed to the disordered network of SWCNT bundles. It is worth noting that the electrical conductivity of the SWCNT buckypaper is even lower than that of the freestanding printed film in the perpendicular direction, which can be attributed to the low density (~0.3 $g/cm^3$) of the buckypaper as a result of filtration approach. Further, the organized pattern of the aligned SWCNT bundles in the freestanding printed films leads to a lower contact resistance across the entire plane of the macrostructure. Also, the stability and reliability of the electrical conductivity upon mechanical deformation (including bending, twisting, and kneading) has been demonstrated (e.g., in 1000-cycle bending measurements), suggesting the capability of the freestanding printed films for ultraflexible electronics.

Figure 7B:
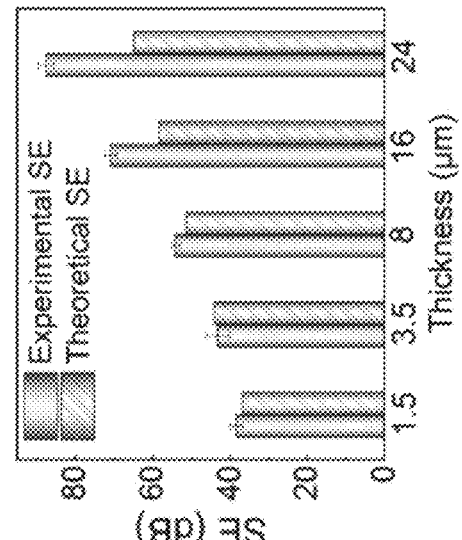
FIG. 7B shows experimental EMI SE at 10 GHz for freestanding printed structures of various thicknesses, in comparison to the theoretical EMI SE of a homogeneous shield.
Figure 7A:
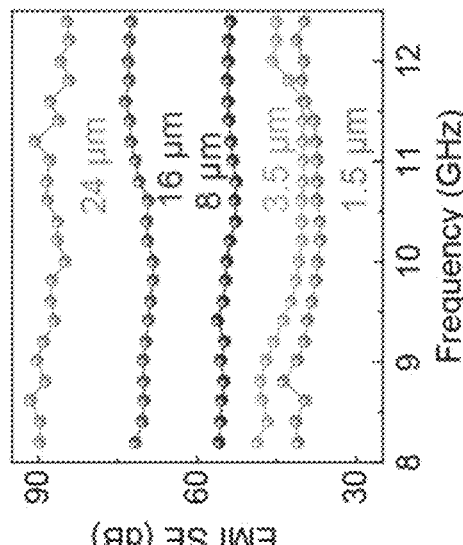
FIG. 7A shows EMI SE in the X-band for freestanding printed structures of various thicknesses.

The ultrathin, flexible, and lightweight SWCNT film provides outstanding EMI shielding performance due to the combination of the film's excellent electrical conductivity, cellular or filamentary structure, and aligned pattern. EMI shielding is a confluence of mechanisms including reflection ($SE_R$), absorption ($SE_A$) and multi-reflections, which result from mobile charge carriers, electric (or magnetic) dipoles, and multiple reflections (multi-reflections) of interior surfaces, respectively, where $SE_T$ represents the sum of $SE_R$ and $SE_A$. The primary parameter affecting the EMI SE is electrical conductivity. The inherent conductivity of SWCNTs and their aligned pattern in the film synergistically give rise to the excellent conductivity of the freestanding printed film, up to 242,988 S/m, leading to an excellent X-band EMI SE of about 54 dB at a thickness of only 8 μm, as shown in FIG. 6A. This SE value corresponds to more than 99.999% attenuation of the incident EM waves, which is far beyond the industry-accepted SE value of 20 dB. The $SE_A$ is higher than $SE_R$ for the SWCNT film, which is consistent with the reported behavior for other carbon-based shielding architectures. The EMI shielding performance (P-$SE_T$, P-$SE_R$, P-$SE_A$) can also be tested in the case when the electric field direction of incident EM waves is perpendicular to the aligned SWCNTs. Compared with the shielding performance ($SE_T$, $SE_R$, $SE_A$) when the EM waves propagate along the aligned SWCNTs, the P-$SE_R$ and P-$SE_T$ (~51 dB) are slightly smaller because of the comparatively lower conductivity in the perpendicular direction, as shown in FIG. 6B. Even so, these $SE_T$ values place the ultrathin SWCNT films among the best EMI shielding materials according to previously reported values. For example, the random network SWCNT buckypaper (previously discussed and having a lower electrical conductivity) can only reach EMI SE values of 28 to 45 dB even at much higher thicknesses of 18 to 60 μm, respectively, as can be seen in FIG. 6C. Furthermore, MWCNT assembled buckypapers with a conductivity of 2,000 S/m show much lower EMI SE values. Indeed, the SE of the 120 μm thick Buckypapers reaches only 14 to 20 dB, which can be attributed to the lower inherent conductivity of MWCNTs. Similarly, while graphene film is one of the most promising EMI shielding materials because of the high intrinsic conductivity of graphene, the conductivity of the most commonly used reduced graphene oxide (RGO) film is still limited because of the inevitable structural deterioration of graphene that occurs during the reduction process. Prepared RGO films with a conductivity of ~7,000 S/m and a density of ~2 $g/cm^3$ reach an EMI SE value of ~22 dB at a thickness of 24 μm; thus, RGO films are vastly outperformed by the aligned SWCNT films, as indicated in FIG. 6C. Moreover, the novel printing process can easily control the thickness of the printed freestanding SWCNT films, resulting in tunable EMI SE values because of the predetermined amount of SWCNTs interacting with the incident EM waves. The EMI SE reaches ~39 and ~90 dB at thicknesses of 1.5 and 24 μm, respectively, as shown in FIG. 7A. Notably, higher thicknesses can be obtained for the printed SWCNT films and the EMI SE can reach above 100 dB, surpassing the upper limit for the instrument used in this experiment. In summary, the excellent EMI SE of the ultrathin freestanding printed films emerges from the outstanding conductivity obtained from the highly aligned and highly conductive SWCNTs.

Other key factors that contribute to EMI shielding can be ascribed to the aligned cellular or filamentary structure of the lightweight SWCNT film, which may have a density of around 0.6 $g/cm^3$ and a porosity of about 60%. The cellular structure offers increased surfaces for the multi-reflections of incident EM waves, resulting in increased opportunities for interactions between the wave and SWCNTs. Moreover, the aligned SWCNT pattern in the films naturally leads to aligned pore channels in the incident EM waves' propagation direction, which has been proven to be instrumental in enhancing the multi-reflections. This emergent behavior combines with the intrinsically high microwave absorption capability derived from high permittivity and abundant charge carriers of the SWCNTs to achieve the high $SE_T$ $(SE_T=SE_A+SE_R)$ values observed. To further understand the influences of the aligned cellular structure on the EMI shielding performance, the experimental and theoretical EMI SE values were compared for SWCNT films of varied thicknesses, as shown in FIG. 7B. For a film with a thickness of 8 μm, a consistent conductivity (242,988 S/m) for the SWCNT film was used to calculate the theoretical SE of a homogenous solid shield, yielding a SE of ~51.4 dB in the X-band frequency range. The lower theoretical SE compared to the experimental value is attributed to the contributions from multi-reflection and scattering of the incident EM waves within the aligned porous structure of the SWCNT films not considered in the theoretical model. Clearly, the experimental SE is close to the theoretical SE at low thicknesses but is higher than predicted value as sample thickness increases). This is a result of the increased pores in thicker samples that promote penetration and absorption of the incident EM waves, enhancing experimental EMI SE values for the SWCNT films. It is the synergistic combination of the inherently excellent conductivity of SWCNTs, the aligned pattern, and the inherent cellular structure, that yields the ultrahigh EMI shielding performance at the low thicknesses and densities observed in the freestanding printed films.

Figure 7C:
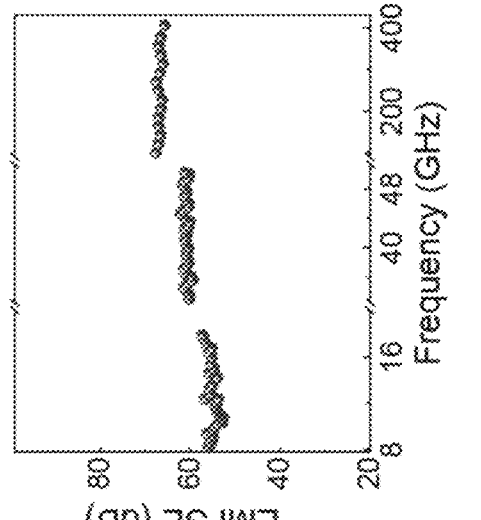
FIG. 7C shows experimental measured EMI SE values of the 8 μm-thick freestanding printed structure in the ultra-broadband frequency range.

In addition, the SE has been measured in various frequency ranges, including 8.2-12.4 GHz (X-band), 12.4-18 GHz (Ku band), 33-50 GHz (Q-band), and 100-400 GHz (Terahertz band) for the SWCNT freestanding printed film, as shown in FIG. 7C. The 8 μm thick SWCNT films can still reach an excellent SE value of more than 54 dB at a qualified bandwidth of around 400 GHz, far exceeding that of other reported shielding materials. Furthermore, the SWCNT films maintain this excellent EMI SE even after a 10,000-cycle bending or rolling treatment, as shown in FIG. 8A, demonstrating excellent shielding stability and durability, and proving their application potential in practical EMI shielding applications, including applications involving an ultra-broadband frequency range.

Figure 9:
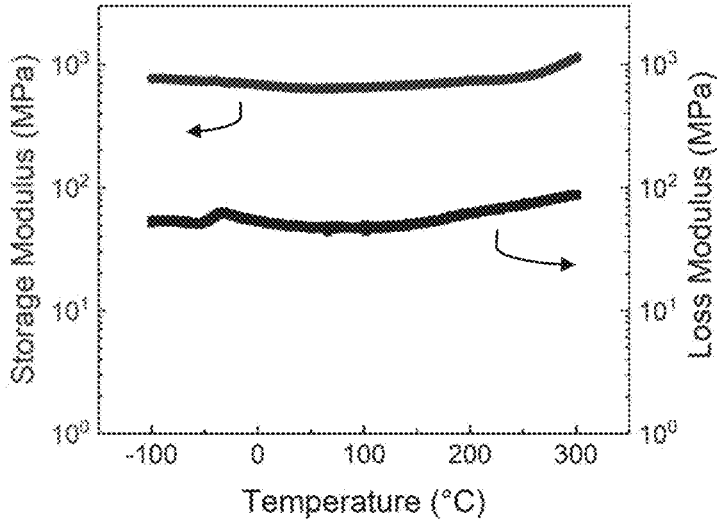
FIG. 9 shows storage and loss modulus of the freestanding printed structures (or films) in a wide range of temperature, showing the stability of the aligned SWCNTs in low/high temperature conditions.

The freestanding printed films not only demonstrate robust shielding and conductivity performance when subjected to mechanical deformation, but also can maintain excellent EMI shielding reliability during exposure to acids, alkalis, and solvents or high/low temperature environments. Separate SWCNT printed films were immersed for 15 days in concentrated hydrochloric acid (37%), sodium hydroxide solution (1 M), and acetone. After these treatments, each SWCNT film still maintains good structural integrity and nearly identical EMI SE values compared to those measured before treatment, as shown in FIG. 8B. In contrast, traditional metal shields or metal nanomaterial based counterparts cannot claim such results. In addition to maintaining excellent mechanical flexibility even while soaked in liquid nitrogen (−196° C.), the SWCNT films exhibit identical EMI SE values after storage at a cryogenic temperature for 10 days, as shown in FIG. 8C. Similarly, even though the SWCNT films were exposed to 400° C. in atmosphere for 10 days, the EMI SE values were only slightly affected, demonstrating good thermal stability across a very broad range. This is consistent with the behavior that the aligned SWCNT films have stable storage and loss modulus over a wide range of temperatures (FIG. 9), which further supports the superiority the SWCNT freestanding printed films over commonly used polymer-based shielding materials. The stability and reliability of the freestanding printed film in a wide variety of harsh environments significantly add to its capacity as a candidate material for next-generation electronics.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. An electromagnetic interference (EMI) shielding material comprising:
   a freestanding printed structure including aligned single-walled carbon nanotubes,
   wherein an alignment direction of the aligned single-walled carbon nanotubes coincides with a parallel direction of the freestanding printed structure, and
   wherein a property of the freestanding printed structure measured along the parallel direction is at least about 1.5 times as high as the property measured along a perpendicular direction of the freestanding printed structure,
   wherein the aligned single-walled carbon nanotubes account for at least about 70% of a total mass of the freestanding printed structure.

2. The EMI shielding material of claim 1, wherein the property is selected from the group consisting of thermal conductivity, electrical conductivity, and mechanical strength.

3. The EMI shielding material of claim 2, wherein the thermal conductivity measured along the parallel direction is at least about 3 times as high as the thermal conductivity measured along the perpendicular direction.

4. The EMI shielding material of claim 2, wherein the electrical conductivity measured along the parallel direction is at least about 2 times as high as the electrical conductivity measured along the perpendicular direction.

5. The EMI shielding material of claim 2, wherein the mechanical strength measured along the parallel direction is at least about 2 times as high as the mechanical strength measured along the perpendicular direction.

6. The EMI shielding material of claim 1, wherein the freestanding printed structure has a thickness-specific shielding effectiveness (SE/d) of at least about 12,000 dB/mm.

7. The EMI shielding material of claim 6, wherein the SE/d is as high as about 26,000 dB/mm.

8. The EMI shielding material of claim 1, wherein the printed freestanding structure comprises a normalized specific shielding effectiveness (SSE) of at least about 37,000 $dB \cdot cm^2/g$.

9. The EMI shielding material of 8, wherein the SSE is as high as about 233,000 $dB \cdot cm^2/g$.

10. The EMI shielding material of claim 1, wherein a shielding effectiveness (SE) of the printed freestanding structure is substantially unchanged before and after exposure to:
    10,000-cycle bending or rolling tests;
    acid, alkali, or acetone immersion treatments; and/or
    −196° C. or 400° C. temperature treatments.

11. The EMI shielding material of claim 1, wherein the freestanding printed structure has a thickness in a range from about 1.5 micron to about 55 microns.

12. The EMI shielding material of claim 1, wherein the freestanding printed structure has a density of about 0.6 g/cm$^3$ or less.

13. The EMI shielding material of claim 1, wherein at least about 30% of the aligned single-walled carbon nanotubes are metallic.

14. The EMI shielding material of claim 1, wherein the aligned single-walled carbon nanotubes are oriented within about +/−10 degrees of the parallel direction.

15. The EMI shielding material of claim 1, wherein the aligned single-walled carbon nanotubes have an average length in a range from about 3 microns to about 10 microns.

16. The EMI shielding material of claim 1, wherein the aligned single-walled carbon nanotubes account for at least about 80% of the total mass of the freestanding printed structure.

17. A method of making an EMI shielding material, the method comprising:

continuously injecting a carbon material solution comprising single-walled carbon nanotubes through a nozzle into a coagulation liquid and moving the nozzle relative to a substrate submerged in the coagulation liquid, thereby forming an extruded filament comprising the single-walled carbon nanotubes and aligning the carbon nanotubes along an axis of the extruded filament;

depositing the extruded filament onto the substrate as the nozzle is moved along a print path, thereby forming a printed structure comprising the single-walled carbon nanotubes aligned along the print path; and after deposition, removing the printed structure from the substrate, thereby forming a freestanding printed structure comprising aligned single-wall carbon nanotubes, wherein a property of the freestanding printed structure measured along the parallel direction is at least about 1.5 times as high as the property measured along a perpendicular direction of the freestanding printed structure, and wherein the aligned single-walled carbon nanotubes account for at least about 70% of a total mass of the freestanding printed structure.

18. The method of claim 17, wherein the coagulation liquid comprises an organic solvent.

19. The method of claim 17, wherein the carbon material solution comprises a concentration of the single-walled carbon nanotubes in a range from about 1 mg/ml to about 5 mg/ml.

20. The method of claim 17, wherein removing the printed structure from the substrate comprises peeling the printed structure from the substrate.

* * * * *